(12) United States Patent
Becker et al.

(10) Patent No.: US 7,590,968 B1
(45) Date of Patent: Sep. 15, 2009

(54) METHODS FOR RISK-INFORMED CHIP LAYOUT GENERATION

(75) Inventors: Scott T. Becker, San Jose, CA (US); Michael C. Smayling, San Jose, CA (US)

(73) Assignee: Tela Innovations, Inc., Campbell, CA (US)

( * ) Notice: Subject to any disclaimer, the term of this patent is extended or adjusted under 35 U.S.C. 154(b) by 135 days.

(21) Appl. No.: 11/680,552

(22) Filed: Feb. 28, 2007

Related U.S. Application Data

(60) Provisional application No. 60/778,236, filed on Mar. 1, 2006.

(51) Int. Cl.
*G06F 17/50* (2006.01)
(52) U.S. Cl. .................................. 716/21; 716/4; 716/5
(58) Field of Classification Search .................... None
See application file for complete search history.

(56) References Cited

U.S. PATENT DOCUMENTS

| | | | | |
|---|---|---|---|---|
| 4,197,555 | A | 4/1980 | Uehara et al. ................. | 357/70 |
| 5,225,998 | A * | 7/1993 | Singhal ........................ | 702/84 |
| 5,378,649 | A | 1/1995 | Huang ......................... | 437/52 |
| 5,581,098 | A | 12/1996 | Chang ......................... | 257/211 |
| 5,682,323 | A | 10/1997 | Pasch et al. ................. | 364/491 |
| 5,684,733 | A | 11/1997 | Wu et al. ..................... | 365/100 |

(Continued)

FOREIGN PATENT DOCUMENTS

WO   WO 2006/014849   2/2006

OTHER PUBLICATIONS

Acar, et al., "A Linear-Centric Simulation Framework for Parametric Fluctuations", 2002, IEEE, Carnegie Mellon University USA, pp. 1-8.

(Continued)

*Primary Examiner*—Leigh Marie Garbowski
(74) *Attorney, Agent, or Firm*—Martine Penilla & Gencarella, LLP

(57) ABSTRACT

A chip layout is generated based on a quantified fabrication process capability. A minimum required value is selected for a fabrication process capability factor associated with a fabrication process to be performed on a layer sub-region within the chip. Design rules are determined for the layer sub-region within the chip that will enable the selected minimum required value for the fabrication process capability factor associated with the layer sub-region to be satisfied. A layout is then generated for the layer sub-region within the chip using the determined design rules associated with the layer sub-region. Fabrication process capability can be improved by restricting the design rules and generated layouts to a linear design style that requires features defined within the chip to be linear in shape and without bends. The linear design style enables optimization of photolithographic rendering without the need to consider two-dimensional optical effects.

9 Claims, 8 Drawing Sheets

U.S. PATENT DOCUMENTS

| | | | | |
|---|---|---|---|---|
| 5,825,203 | A | 10/1998 | Kusunoki et al. | 326/41 |
| 5,841,663 | A | 11/1998 | Sharma et al. | 364/490 |
| 5,847,421 | A | 12/1998 | Yamaguchi | 257/207 |
| 5,898,194 | A | 4/1999 | Gheewala | 257/206 |
| 5,908,827 | A | 6/1999 | Sirna | 514/12 |
| 5,923,059 | A | 7/1999 | Gheewala | 257/204 |
| 5,935,763 | A | 8/1999 | Caterer et al. | 430/313 |
| 5,977,305 | A | 11/1999 | Wigler et al. | 530/350 |
| 6,100,025 | A | 8/2000 | Wigler et al. | 435/6 |
| 6,174,742 | B1 | 1/2001 | Sudhindranath et al. | 438/14 |
| 6,182,272 | B1 | 1/2001 | Andreev et al. | 716/13 |
| 6,194,252 | B1 | 2/2001 | Yamaguchi | 438/129 |
| 6,194,912 | B1 | 2/2001 | Or-Bach | 326/38 |
| 6,240,542 | B1 | 5/2001 | Kapur | 716/12 |
| 6,255,600 | B1 | 7/2001 | Schaper | 174/255 |
| 6,275,973 | B1 | 8/2001 | Wein | 716/10 |
| 6,331,733 | B1 | 12/2001 | Or-Bach et al. | 257/758 |
| 6,338,972 | B1 | 1/2002 | Sudhindranath et al. | 438/14 |
| 6,416,907 | B1 | 7/2002 | Winder et al. | 430/5 |
| 6,425,117 | B1 | 7/2002 | Pasch et al. | 716/21 |
| 6,476,493 | B2 | 11/2002 | Or-Bach et al. | 257/758 |
| 6,480,989 | B2 | 11/2002 | Chan et al. | 716/8 |
| 6,505,327 | B2 | 1/2003 | Lin | 716/5 |
| 6,525,350 | B1 | 2/2003 | Kinoshita et al. | 257/202 |
| 6,536,028 | B1 | 3/2003 | Katsioulas et al. | 716/17 |
| 6,571,140 | B1 | 5/2003 | Wewalaarachchi | 700/83 |
| 6,590,289 | B2 | 7/2003 | Shively | 257/758 |
| 6,591,207 | B2 | 7/2003 | Naya et al. | 702/81 |
| 6,620,561 | B2 | 9/2003 | Winder et al. | 430/5 |
| 6,661,041 | B2 | 12/2003 | Keeth | 257/211 |
| 6,691,297 | B1 | 2/2004 | Misaka et al. | 716/21 |
| 6,714,903 | B1 | 3/2004 | Chu et al. | 703/19 |
| 6,737,199 | B1 | 5/2004 | Hsieh | 430/5 |
| 6,745,372 | B2 | 6/2004 | Cote et al. | 716/2 |
| 6,783,904 | B2* | 8/2004 | Strozewski et al. | 430/30 |
| 6,792,593 | B2 | 9/2004 | Takashima et al. | 716/21 |
| 6,795,952 | B1 | 9/2004 | Stine et al. | 716/5 |
| 6,799,152 | B1* | 9/2004 | Chen et al. | 703/14 |
| 6,807,663 | B2 | 10/2004 | Cote et al. | 716/21 |
| 6,819,136 | B2 | 11/2004 | Or-Bach | 326/41 |
| 6,834,375 | B1 | 12/2004 | Stine et al. | 716/2 |
| 6,850,854 | B2 | 2/2005 | Naya et al. | 702/81 |
| 6,854,100 | B1 | 2/2005 | Chuang et al. | 716/5 |
| 6,877,144 | B1 | 4/2005 | Rittman et al. | 716/10 |
| 6,884,712 | B2 | 4/2005 | Yelehanka et al. | 438/622 |
| 6,904,582 | B1 | 6/2005 | Rittman et al. | 716/10 |
| 6,928,635 | B2 | 8/2005 | Pramanik et al. | 716/21 |
| 6,931,617 | B2 | 8/2005 | Sanie et al. | 716/18 |
| 6,953,956 | B2 | 10/2005 | Or-Bach et al. | 257/203 |
| 6,978,437 | B1 | 12/2005 | Rittman et al. | 716/21 |
| 6,992,925 | B2 | 1/2006 | Peng | 365/177 |
| 7,028,285 | B2 | 4/2006 | Cote et al. | 716/21 |
| 7,041,568 | B2 | 5/2006 | Goldbach et al. | 438/387 |
| 7,064,068 | B2 | 6/2006 | Chou et al. | 438/687 |
| 7,093,228 | B2 | 8/2006 | Andreev et al. | 716/21 |
| 7,103,870 | B2 | 9/2006 | Misaka et al. | 716/21 |
| 7,120,882 | B2 | 10/2006 | Kotani et al. | 716/5 |
| 7,137,092 | B2 | 11/2006 | Maeda | 716/8 |
| 7,149,999 | B2 | 12/2006 | Kahng et al. | 716/19 |
| 7,155,689 | B2 | 12/2006 | Pierrat | 716/4 |
| 7,225,051 | B1* | 5/2007 | Christensen et al. | 700/193 |
| 7,257,790 | B2* | 8/2007 | Maeda | 716/10 |
| 7,278,118 | B2 | 10/2007 | Pileggi et al. | 716/1 |
| 2003/0042930 | A1 | 3/2003 | Pileggi et al. | 326/41 |
| 2004/0145028 | A1 | 7/2004 | Matsumoto et al. | 257/620 |
| 2004/0161878 | A1 | 8/2004 | Or-Bach et al. | 438/113 |
| 2004/0243966 | A1 | 12/2004 | Dellinger | 716/17 |
| 2005/0055828 | A1 | 3/2005 | Wang et al. | 29/857 |
| 2005/0101112 | A1 | 5/2005 | Rueckes et al. | 438/584 |
| 2005/0189614 | A1 | 9/2005 | Ihme et al. | 257/532 |
| 2005/0224982 | A1 | 10/2005 | Kemerling et al. | 257/758 |
| 2006/0106469 | A1* | 5/2006 | Huang et al. | 700/51 |
| 2006/0112355 | A1 | 5/2006 | Pileggi et al. | 716/1 |
| 2006/0121715 | A1 | 6/2006 | Chang et al. | |
| 2006/0151810 | A1 | 7/2006 | Ohshige | 257/207 |
| 2006/0206851 | A1* | 9/2006 | Van Wingerden et al. | 716/19 |
| 2006/0223302 | A1 | 10/2006 | Chang et al. | |

OTHER PUBLICATIONS

Amazawa, et al., "Fully Planarized Four-Level Interconnection with Stacked VLAS Using CMP of Selective CVD-A1 and Insulator and its Application to Quarter Micron Gate Array LSIs", 1995, IEEE, Japan, pp. 473-476.

Burkhardt, et al., "Dark Field Double Dipole Lithography (DDL) for Back-End-Of-Line Processes", 2007, SPIE Proceedings Series, vol. 6520; 65200K, 10 pages.

Capetti, et al., "Subn k1=0.25 Lithography with Double Patterning Technique for 45nm Technology Node Flash Memory Devices at λ=193 nm", 2007, SPIE Proceedings Series, vol. 6520; 65202K, 12 pages.

Chandra, et al., "An Interconnect Channel Design Methodology for High Performance Integrated Circuits", 2004, IEEE, Carnegie Mellon University, pp. 1-6.

Cheng, et al., "Feasibility Study of Splitting Pitch Technology on 45nm Contact Paterning with 0.93 NA", 2007, SPIE Proceedings Series, vol. 6520; 65202N, 8 pages.

Chow, et al., "The Design of a SRAM-Based Field-Programmable Gate Array—Part II: Circuit Design and Layout", 1999, IEEE, vol. 7 #3 pp. 321-330.

DeVor, et al., "Statistical Quality Design and Control", 1992, Macmillan Publishing Company, pp. 264-267.

Dusa, et al. "Pitch Doubling Through Dual Patterning Lithography Challenges in Integration and Litho Budgets", 2007, SPIE Proceedings Series, vol. 6520; 65200G, 10 pages.

El-Gamal, "Fast, Cheap and Under Control: The Next Implementation Fabric", Jun. 2-6, 2003, ACM Press, pp. 354-355.

Frankel, "Quantum State Control Interference Lithography and Trim Double Patterning for 32-16nm Lithography", 2007, SPIE Proceedings Series, vol. 6520; 65202L, 9 pages.

Hayashida, et al., "Manufactuable Local Interconnect technology Fully Compatible with Titanium Salicide Process", Jun. 11-12, 1991, VMIC Conference, pp. 332-334.

Heng, et al., "A VLSI Artwork Legalization Technique Base on a New Criterion of Minimum Layout Perturbation", 1997, ACM Press, pp. 116-121.

Hu, et al., "Synthesis and Placemant Flow for Gain-Based Programmable Regular Fabrics", Apr. 6-9, 2003, ACM Press, pp. 197-203.

Hutton, et al., "A Methodology for FPGA to Structured-ASIC Synthesis and Verification", 2006, EDAA, pp. 64-69.

Jayakumar, et al., "A Metal and VIA Maskset Programmable VLSI Design Methodology using PLAs", 2004, IEEE, pp. 590-594.

Kheterpal, et al., "Routing Architecture Exploration for Regulator Fabrics", DAC, Jun. 7-11, 2004, ACM Press, pp. 204-207.

Kheterpal, et al., "Design Methodology for IC Manufactrability Based on Regular Logic-Bricks", DAC, Jun. 13-17, 2005, IEEE/AMC, vol. 6520, pp. 353-358.

Kim, et al., "Issues and Challenges of Double Patterning Lithography in DRAM", 2007, SPIE Proceeding Series, vol. 6520; 65200H, 7 pages.

Kim, et al., "Double Exposure Using 193nm Negative Tone Photoresist", 2007, SPIE Proceeding Series, vol. 6520; 65202M, 8 pages.

Koorapaty, et al., "Heterogeneous Logic Block Architectures for Via-Patterned Programmable Fabric", 13th International Conference on Field Programmable Logic and Applications (FPL) 2003, Lecture Notes in Computer Sciences (LNCS), Sep. 2003, Springer-Verlag, vol. 2778, pp. 426-436.

Koorapaty, et al., "Modular, Fabric-Specific Synthesis for Programmable Architectures", 12th International Conference on Field Programmable Logic and Applications (FPL_2002, Lecture Notes in Computer Science (LNCS)), Sep. 2002, Springer-Verlag, vol. 2438 pp. 132-141.

Koorapaty, et al., "Exploring Logic Block Granularity for Regular Fabrics", 2004, IEEE, pp. 1-6.

Li, et al., "A Linear-Centric Modeling Approach to Harmonic Balance Analysis", 2002, IEEE, pp. 1-6.

Li, et al., "Nonlinear Distortion Analysis Via Linear-Centric Models", 2003, IEEE, pp. 897-903.

Liebmann et al., "Integrating DfM Components Into a Cohesive Design-To-Silicon Solution", IBM Systems and Technology Group, b IBM Research, pp. 1-12.

Liebmann, et al., "High-Performance Circuit Design for the RET-Enabled 65nm Technology Node", Feb. 26-27, 2004, SPIE Proceeding Series, vol. 5379 pp. 20-29.

Liu, et al., "Double Patterning with Multilayer Hard Mask Shrinkage for Sub-0.25 k1 Lithography", 200, SPIE Proceedings Series, vol. 6520; 65202J, 8 pages.

Mo, et al., "Checkerboard: A Regular Structure and its Synthesis, International Workshop on Logic and Synthesis", 2003, Department of Electrical Engineering and Computer Sciences, UC Berkeley, California, pp. 1-7.

Mo, et al., "PLA-Based Regular Structures and Their Synthesis", 2003, Department of Electrical Engineering and Computer Sciences, IEEE, pp. 732-729.

Mo, et al., "Regular Farbrics in Deep Sub-Micron Integrated-Circuit Design", 2004, Kluwer Academic Publishers, Entire Book, pp. 1-242.

Op de Beek, et al., "Manufacturability issues with Double Patterning for 50nm half pitch damscene applications, using RELACS® shrink and corresponding OPC", 2007, SPIE Proceeding Series, vol. 6520; 65200I, 13 pages.

Or-Bach, "Programmable Circuit Fabrics", Sep. 18, 2001, e-ASIC, pp. 1-36.

Otten, et al., "Planning for Performance", DAC 1998, ACM Inc., pp. 122-127.

Pandini, et al., "Congestion-Aware Logic Synthesis", 2002, IEEE, pp. 1-8.

Pandini, et al., "Understanding and Addressing the Impact of Wiring Congestion During Technology Mapping", ISPD Apr. 7-10, 2002, ACM Press, pp. 131-136.

Patel, et al., "An Architectural Exploration of Via Patterned Gate Arrays, ISPD 2003", Apr. 6, 2003, pp. 184-189.

Pileggi, et al., "Exploring Regular Fabrics to Optimize the Performance-Cost Trade-Offs, Proceedings of the 40th ACM/IEEE Design Automation Conference (DAC) 2003", Jun. 2003, ACM Press, pp. 782-787.

Poonawala, et al., "ILT for Double Exposure Lithography with Conventional and Novel Materials", 2007, SPIE Proceeding Series, vol. 6520; 65202Q, 14 pages.

Ran, et al., "Designing a Via-Configurable Regular Fabric", Custom Integrated Circuits Coference (CICC). Proceedings of the IEEE, Oct. 2004, Oct. 1, 2004, pp. 423-426.

Ran, et al., "On Designing Via-Configurable Cell Blocks for Regular Fabrics" Proceedings of the Design Automation Conference (DAC) 2004, Jun. 2004, ACM Press, s 198-203.

Ran, et al., "An Integrated Design Flow for a Via-Configurable Gate Array", 2004, IEEE, pp. 582-589.

Ran, et al., "Via-Configurable Routing Architectures and Fast Design Mappability Estimation for Regular Fabrics", 2005, IEEE, pp. 25-32.

Ran, et al., "The Magic of a Via-Configurable Regular Fabric", Proceedings of the IEEE International Conference on Computer Design (ICCD) Oct. 2004, 6 pages.

Reis, et al., "Physical Design Methodologies for Performance Predictability and Manufacturability", Apr. 14-16, 2004, ACM Press, pp. 390-397.

Robertson, et al., "The Modeling of Double Patterning Lithographic Processes", 2007, SPIE Proceeding Series, vol. 6520; 65200J.

Rovner, "Design for Manufacturability in Via Programmable Gate Arrays", May 2003, Graduate School of Cagegie Mellon University, 38 pages.

Sengupta, "An Integrated CAD Framework Linking VLSI Layout Editors and Process Simulators", 1998, Thesis for Rice University, pp. 1-101.

Sengupta, et al., "An Integrated CAD Framework Linking VLSI Layout Editors and Process Simulators", 1996, SPIE Proceeding Series, vol. 2726; pp. 244-252.

Sherlekar, "Design Considerations for Regular Fabrics", Apr. 18-21, 2004, ACM Press, pp. 97-102.

Stapper, "Modeling of Defects in Integrated Circuit Photolithographic Patterns", Jul. 1, 1984, IBM, vol. 28 #4, pp. 461-475.

Taylor, et al., "Enabling Energy Efficiency in Via-Patterned Gate Array Devices", Jun. 7-11, 2004, ACM Press, pp. 874-877.

Tong, et al., "Regular Logic Fabrics for a Via Patterned Gate Array (VPGA), Custom Integrated Circuits Conference", Sep. 2003, Proceedings of the IEEE, pp. 53-56.

Vanleehgove, et al., "A Litho-Only Approach to Double Patterning", 2007, SPIE Proceeding Series, vol. 6520; 65202F, 10 pages.

Wenren, et al., "The Improvement of Photolithographic Fidelity of Two-dimensional Structures Though Double Exposure Method", 2007, SPIE Proceeding Series, vol. 6520; 65202I, 12 pages.

Wilcox, et al., "Design for Manufacturability: A Key to Semiconductor Manufacturing Excellence", 1998, IEEE, pp. 308-313.

Wu, et al., "A Study of Process Window Capabilities for Two-dimensional Structures under Double Exposure Condition", 2007, SPIE Proceeding Series, vol. 6520; 65202O, 10 pages.

Xiong, et al., "The Constrained Via Minimization Problem for PCB and VLSI Design", 1988, ACM Press/IEEE, pp. 573-578.

Yamamaoto, et al., "New Double Exposure Technique without Alternating Phase Shift Mask", 2007, SPIE Proceeding Series, vol. 6520; 652052P, 11 pages.

Yang, et al., "Interconnection Driven VLSI Module Placement Based on Quadratic Programming and Considering Congestion Using LFF Principles", 2004, IEEE, pp. 1243-1247.

Yao, et al., "Multilevel Routing With Redundant Via Insertion", Oct. 2006, IEEE, pp. 1148-1152.

Zheng, et al. "Modeling and Analysis of Regular Symmetrically Structured Power/Ground Distribution Networks", DAC, Jun. 10-14, 2002, ACM Press, pp. 395-398.

Zhu, et al., "A Study of Double Exposure Process Design with Balanced Performance Parameters for Line/Space Applications", 2007, SPIE Proceeding Series, vol. 6520; 65202H, 11 page.

Zuchowksi, et al., "A Hybrid ASIC and FPGA Architecture", 2003, IEEE, pp. 187-194.

U.S. Appl. No. 60/625,342, filed May 25, 2006, Pileggi et al.

Wang, J. et al., Standard Cell Layout with Regular Contact Placement, IEEE Trans. on Semicon. Mfg., vol. 17, No. 3, Aug. 2004, pp. 375-383.

Kang, S.M., Metal-Metal Matrix (M3) for High-Speed MOS VLSI Layout, IEEE Trans. on CAD, vol. CAD-6, No. 5, Sep. 1987, pp. 886-891.

Liebmann, L. W., Layout Impact of Resolution Enhancement Techniques: Impediment or Opportunity?, International Symposium on Physical Design, 2003, pp. 110-117.

Jhaveri, T. et al., Maximization of Layout Printability/Manufacturability by Extreme Layout Regularity, Proc. of the SPIE, Apr. 2006, 16 pages.

* cited by examiner

METHODS FOR RISK-INFORMED CHIP LAYOUT GENERATION

CLAIM OF PRIORITY

This application claims priority under 35 U.S.C. 119(e) to U.S. Provisional Patent Application No. 60/778,236, filed Mar. 1, 2006. This provisional application is incorporated herein by reference.

BACKGROUND

In the design and manufacture of semiconductor devices, design rules are developed to enable successful design-for-manufacture. The design rules provide guidelines for constraining a design envelope such that a device designed within the design envelope will have a high probability of being manufacturable. Traditionally, design rules are developed based on capabilities of the manufacturing process. Also, traditional design rules are developed to accommodate a general design style. The general design style allows for layout of semiconductor device features in a given chip layer in essentially any two-dimensional configuration. Thus, it should be appreciated that the design rules associated with the general design style are defined to represent manufacturing process capabilities associated with manufacturing an essentially open-ended spectrum of two-dimensional device features and interactions.

Because the design rules for the general design style need to cover the manufacturable corners of the design envelope, the design rules for the general design style can be complex and difficult to manage. Also, if design rules defined to cover the manufacturable corners of the design envelope are utilized in developing a design that does not approach the corners of the design envelope, the developed design can be overly conservative. The conservatism in the developed design can manifest as increased expense, increased complexity, inefficient use of chip area, inefficient consumption of power, etc.

As semiconductor device size decreases, the photolithography requirements associated with device manufacture become limiting such that the design rules associated with the manufacturing process are driven by the photolithography requirements. More specifically, modern semiconductor device sizes are smaller than the wavelength of light used to pattern the devices in the photolithography process. For example, 193 nanometers (nm) is a common wavelength of light used to pattern feature sizes of about 65 nm. Lithographic gap refers to the difference between the wavelength of light used to pattern a particular feature and the actual size of the particular feature. A number of difficulties arise when patterning devices that are smaller than the light wavelength. For example, forbidden feature pitches may exist, wherein light used to pattern adjacent features adversely interacts such that the patterned features are unacceptably defined.

It should be appreciated that lithographic gap difficulties are further compounded in the general design style, wherein optical effects associated with patterning two-dimensional features are unpredictable and often unacceptable. Techniques such as optical proximity correction and reticle enhancement technology, among others, have been developed in an attempt to compensate for the lithographic gap difficulties. However, these techniques are not always capable of fully compensating for adverse feature patterning artifacts. Additionally, implementation of these techniques can be quite expensive with respect to economics and time.

To accommodate the drive toward smaller semiconductor device sizes while maintaining manufacturability at the corners of the general design style envelope, modern design rules are becoming cumbersome, if not impossible, to communicate and implement. Additionally, techniques used to compensate for lithographic gap are becoming more complicated and expensive to implement. In view of the foregoing, the traditional semiconductor device design-for-manufacture paradigm needs to be reconsidered.

SUMMARY

In one embodiment, a method is disclosed for designing a chip in a linear design style. The method includes defining a layout for a lower-level layer sub-region within the chip. The layout for the lower-level layer sub-region is defined to include only features that are linear in shape and positioned in a parallel orientation with respect to adjacent features within the lower-level layer sub-region. The method also includes defining a layout for a higher-level layer sub-region within the chip, wherein the higher-level layer sub-region overlies the lower-level layer sub-region. The layout for the higher-level layer sub-region includes only features that are linear in shape and positioned in a parallel orientation with respect to adjacent features within the higher-level layer sub-region. Additionally, the features in the higher-level layer sub-region are oriented to be non-parallel with respect to features in the lower-level layer sub-region.

In another embodiment, a method is disclosed for characterizing a chip fabrication process capability. The method includes identifying a measurable parameter indicative of a fabrication process result. The method also includes determining a distribution of the parameter that is representative of a frequency of occurrence of values of the parameter. The distribution is defined by a mean and a standard deviation. The method further includes establishment of fabrication process requirements by defining a lower specification limit and an upper specification limit for the parameter. The method continues with computation of a fabrication process capability factor that represents a minimum fraction of three standard deviations that is between the mean of the distribution and either the lower specification limit or the upper specification limit. Then, according to the method, the fabrication process capability factor is evaluated to determine whether or not the fabrication process is capable of satisfying the fabrication process requirements.

In another embodiment, a method is disclosed for generating a chip layout based on fabrication process capability. The method includes selecting a minimum required value for a fabrication process capability factor associated with a fabrication process to be performed on a layer sub-region within a chip. The method also includes determining design rules for the layer sub-region within the chip, wherein the determined design rules enable the selected minimum required value for the fabrication process capability factor associated with the layer sub-region to be satisfied. The method further includes generating a layout for the layer sub-region within the chip using the determined design rules associated with the layer sub-region.

In another embodiment, a method is disclosed for generating a chip layout according to selection of fabrication process capability factors. The method includes an operation for selecting a minimum required value for a fabrication process capability factor associated with front end of line (FEOL) fabrication processes in which transistor devices are to be formed. An operation is then performed to determine design rules that will ensure satisfaction of the minimum required value for the fabrication process capability factor associated with the FEOL fabrication processes. The method also includes an operation for selecting a minimum required value for a fabrication process capability factor associated with critical route layer fabrication processes. An operation is then performed to determine design rules that will ensure satisfaction of the minimum required value for the fabrication process capability factor associated with the critical route layer fabrication processes. In another operation, adverse interactions between the design rules determined for the FEOL and critical route layer fabrication processes are resolved. The method continues with an operation for selecting a minimum required value for a fabrication process capability factor associated with non-critical route layer fabrication processes. An operation is then performed to determine design rules that will ensure satisfaction of the minimum required value for the fabrication process capability factor associated with the non-critical route layer fabrication processes. In another operation, adverse interactions between the design rules determined for the critical route layer and non-critical route layer fabrication processes are resolved. The method then continues with an operation for generating layouts for the FEOL, critical route layer, and non-critical route layer portions of the chip using a netlist and the determined design rules.

Other aspects and advantages of the invention will become more apparent from the following detailed description, taken in conjunction with the accompanying drawings, illustrating by way of example the present invention.

DETAILED DESCRIPTION

Figure 1:
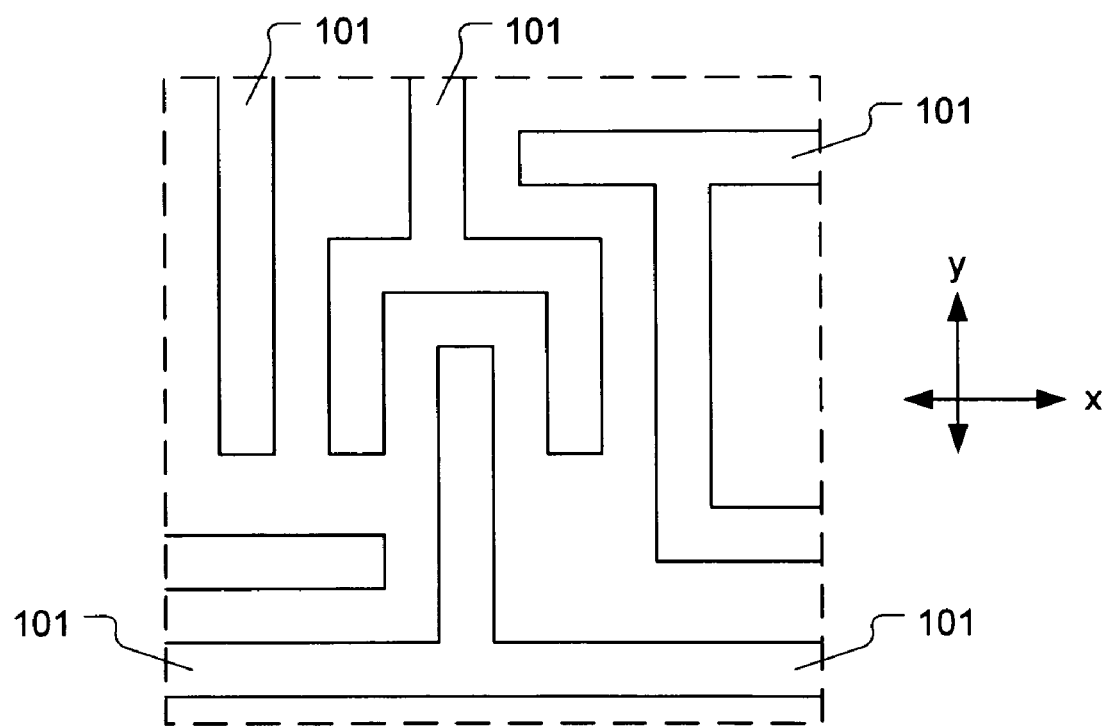
FIG. 1 is an illustration showing a portion of layout defined in a general design style.

In the following description, numerous specific details are set forth in order to provide a thorough understanding of the present invention. It will be apparent, however, to one skilled in the art that the present invention may be practiced without some or all of these specific details. In other instances, well known process operations have not been described in detail in order not to unnecessarily obscure the present invention.

In the fabrication of semiconductor devices such as integrated circuits, memory cells, and the like, a series of manufacturing operations are performed to define features on a chip (or die) on a semiconductor wafer (wafer). Each chip on the wafer includes integrated circuit devices in the form of multi-level structures defined on a silicon substrate. At a substrate level, transistor devices with diffusion regions are formed. In subsequent levels, interconnect metallization lines are patterned and electrically connected to the transistor devices to define a desired integrated circuit device. Also, patterned conductive layers are insulated from other conductive layers by dielectric materials.

The structural features used to define the diffusion regions, transistor devices, metallization lines, interconnects, etc. within each level of the chip are defined according to a specified layout, wherein the specified layout is defined in accordance with a set of design rules. The design rules are developed and applied to enable successful design-for-manufacture. The design rules provide guidelines for constraining a design envelope associated with a particular design style such that a device designed in the particular design style and defined within the guidelines specified by the design rules will have a known probability of being successfully manufactured.

In one embodiment of the present invention, design rules are developed based on a design style to be used, manufacturing process capabilities associated with the design style to be used, and a risk profile to be applied to the chip. It should be appreciated that design rules are implemented in a binary manner, i.e., pass/fail. Thus, a design that complies with all design rules is considered acceptable, and a design that does not comply with all design rules is considered unacceptable. It should be further appreciated that a set of design rules as defined in the present invention can be specified for an entire chip, for one or more layers within a chip, or for one or more layer sub-regions within a given layer of a chip.

To describe the present invention, it is beneficial to first described considerations that influence design rule definition, including design style, manufacturing process capability, and risk profile. In the present invention, design rules are developed to control feature layout within the chip. The design rules are associated with a particular design style and manufacturing process capability corresponding to the particular design style. As will be appreciated by those skilled in the art, feature layout within a layer of a chip corresponds to how structural features defining transistor device components, interconnect lines, and the like, are positioned with respect to one another within the layer of the chip. In developing the feature layout for a given layer of the chip, it necessary to consider both the relationships between features within the given layer, and the relationships between features of the given layer and features of adjacent layers. For example, within a given layer, the layout will consider spacing requirements between adjacent features. Also for example, the layout will consider layer-to-layer registration requirements such that sufficient overlap is maintained between features in adjacent layers to ensure that layer-to-layer contacts are fully landed.

The design style refers to the manner in which features within each layer of the chip are allowed to be configured and positioned with respect to each other. In a general design style, features are allowed to be configured and positioned with respect to each other in essentially a two-dimensional configuration. FIG. 1 is an illustration showing a portion of layout defined in a general design style. Considering that a layer of a chip is typically defined to have substantially uniform thickness, the general design style as exemplified in FIG. 1 allows features 101 to be defined in essentially any two-dimensional configuration according to an x-y coordinate system defined across the layer of the chip. More specifically, the structure of the features 101 can be defined to traverse the layer of the chip in any orthogonal manner according to the x and/or y directions. Also, the general design style allows features 101 to be positioned with respect to one another in essentially any orientation so long as the structure of the features 101 are coincident with the x and/or y directions. Thus, in the general design style, a designer is allowed to create layouts that include any number of two-dimensional feature shapes positioned relative to each other in any number of orthogonal configurations.

Those skilled in the art will appreciate that fabrication of layouts in the general design style can be quite difficult. For example, patterning of two-dimensional feature shapes in close proximity to one another using photolithography techniques can involve adverse and complicated optical interactions. This difficulty is compounded in modern semiconductor fabrication by lithographic gap. Lithographic gap is defined as the difference between the wavelength of light used to pattern features and the actual size of the features, wherein the actual size of the features is less than the wavelength of light. Techniques such as optical proximity correction (OPC), reticle enhancement technology (RET), and the like, have been and continue to be developed to compensate for the lithographic gap. However, in the general design style, complex optical interactions associated with patterning two-dimensional feature shapes are often misunderstood or incorrectly predicted when applying the lithographic gap compensation techniques. Thus, the lithographic gap compensation techniques as applied to the general design style cannot themselves ensure successful manufacture of any possible layout design.

Consequently, design rules are developed for the general design style to provide guidelines for creating a layout in the general design style that is more likely to be successfully manufactured given the fabrication process capabilities, including the lithographic gap compensation techniques. The design rules for the general design style have traditionally been developed to cover the broadest possible design envelope, i.e., the broadest possible scope of layout configurations that a designer may specify. Thus, the design rules for the general design style attempt to address corners of the design envelope as represented by two-dimensional layout features associated with complex optical interactions in the photolithography process. Because design rules for the general design style attempt to ensure manufacturability over the broadest possible design envelope and are driven by the corners of the design envelope, the design rules for the general design style can be complex, difficult to manage, and difficult to communicate.

Additionally, design rules for the general design style essentially follow a one-size-fits all approach in which any design, no matter how simple, is required/expected to follow design rules that are established to ensure a high likelihood of successfully manufacturing complex designs that lie on the fringe of the design envelope. Consequently, the more simple layout designs are driven to be more conservative than necessary, thus making the more simple layout designs inefficient with respect to expense, time, resources, complexity, chip area, power consumption, etc.

The present invention provides an alternative to the general design style to address the previously discussed problems associated with lithographic gap, complex design rules, and inefficient design. More specifically, the present invention specifies that each layer and/or layer sub-region within the chip be defined using a linear design style, i.e., linear layout style. The linear design style requires that layout features be linear in shape, i.e., extending in one dimension without bends, and be positioned in a parallel orientation with respect to each other within a given chip layer or layer sub-region.

It will be appreciated by those skilled in the art that in chip manufacturing the deposition, removal, and implantation of materials at precise locations is enabled by the photolithography process. In the photolithography process, a photoresist material is first deposited onto the die. The photoresist material is then exposed to radiation filtered by a reticle. The reticle is generally a glass plate that is patterned with layout feature geometries that block some of the radiation from passing through the reticle to the die. Thus, the reticle represents a mask of layout feature geometries to be defined within a particular layer of the chip. After passing through the reticle with mask defined thereon, the radiation contacts the surface of the photoresist material and changes the chemical composition of the exposed photoresist material. With a positive photoresist material, exposure to the radiation causes the exposed photoresist material to become more soluble in a developing solution. Conversely, with a negative photoresist material, exposure to the radiation causes the exposed photoresist material to become less soluble in the developing solution.

Following exposure to the radiation, the photoresist material is subjected to a developing process in which the photoresist material is exposed to a developing solution to dissolve portions of the photoresist material that have been made more soluble by exposure to the radiation. Thus, the more soluble portions of the photoresist material are removed by dissolution in the developing solution, leaving a patterned photoresist layer. Once the photoresist material has been developed to reveal the patterned photoresist layer, the wafer is processed to remove, deposit, or implant materials in the wafer regions not covered by the patterned photoresist layer. Therefore, it should be appreciated that if the photoresist layer is not accurately patterned, the wafer regions that are not covered by the patterned photoresist layer will be inaccurately defined, and the subsequent wafer processing will be correspondingly inaccurate. Thus, it is important to ensure that the desired layout features are accurately rendered on the die during the photolithography process. The linear design style of the present invention enables accurate prediction of optical effects during projection of the layout features on the die. Thus, when contrasted with the general design style, the linear design style enables more accurate photolithographic rendering of the layout features on the die.

Figure 2A:
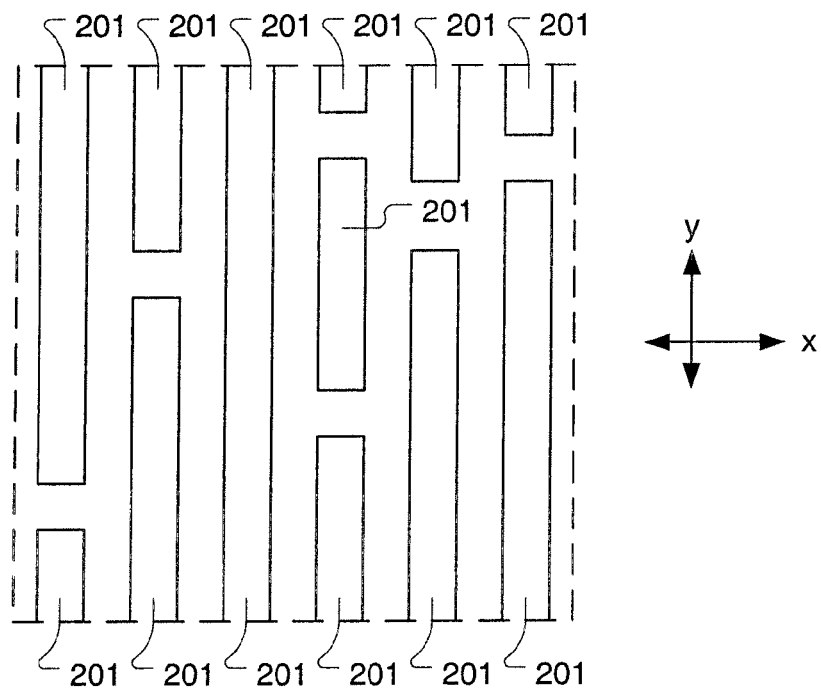
FIGS. 2A-2D are illustrations depicting examples of the linear design style, in accordance with embodiments of the present invention.
Figure 2B:
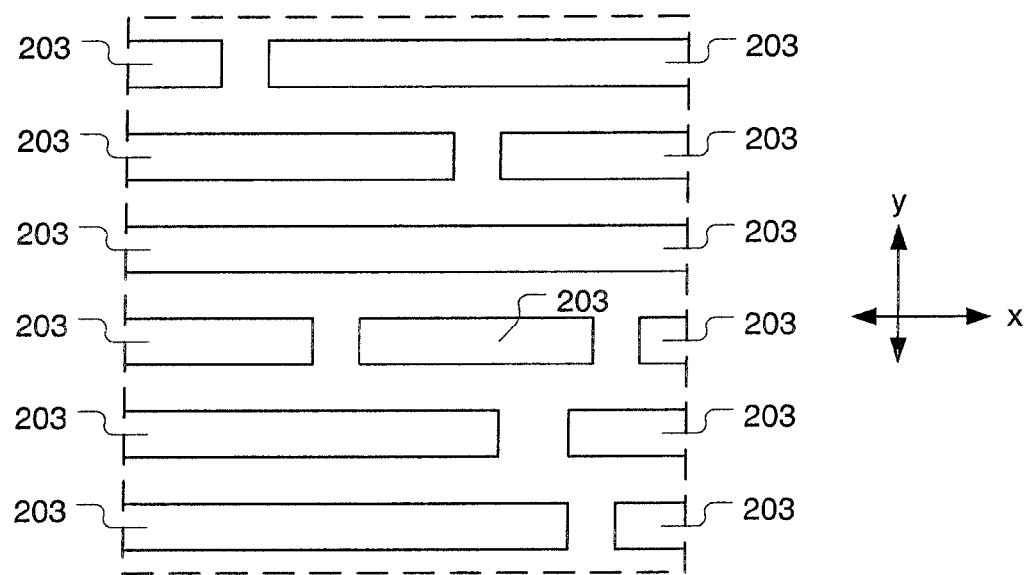
Figure 2C:
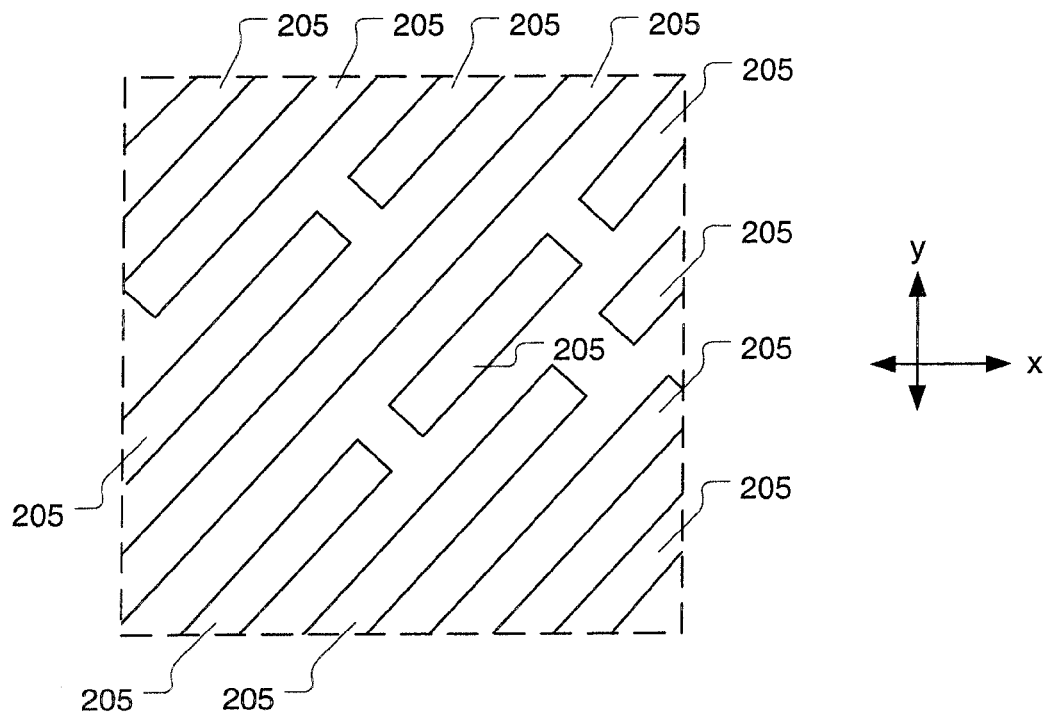
Figure 2D:
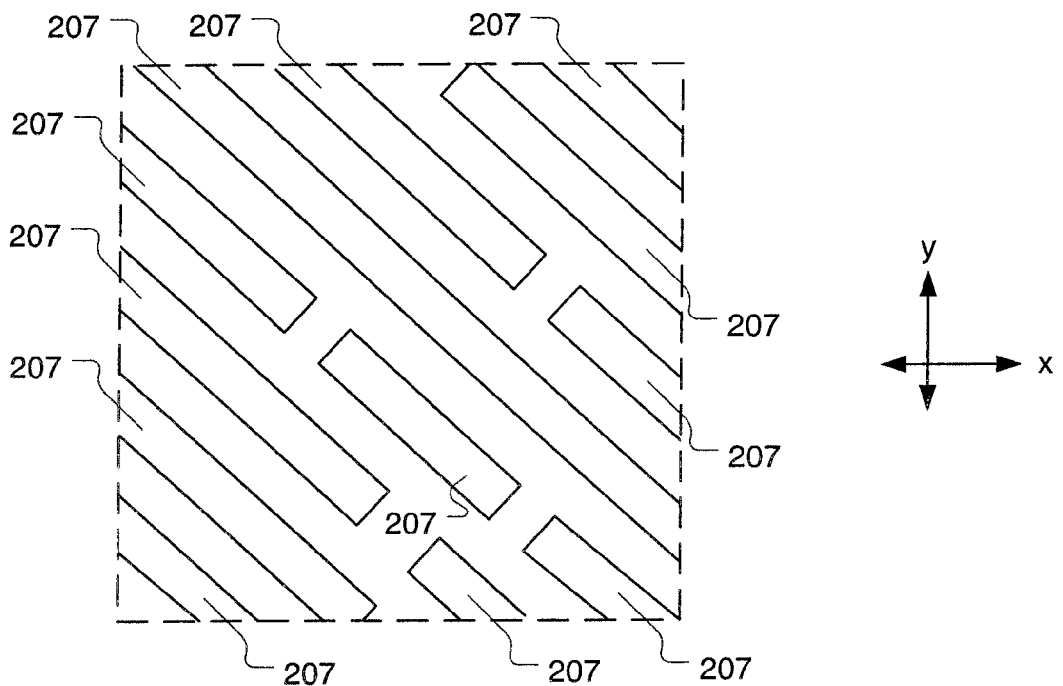

FIGS. 2A-2D are illustrations depicting examples of the linear design style, in accordance with one embodiment of the present invention. It should be understood that the features represented in each of FIGS. 2A-2D can correspond to structures to be built-up on the die and/or to existing portions of the die that are to be exposed to further processing/modification. FIG. 2A shows features 201 defined in the linear design style, wherein each feature 201 extends only in the y direction, and each feature 201 is parallel to one another. FIG. 2B shows features 203 defined in the linear design style, wherein each feature 203 extends only in the x direction, and each feature 203 is parallel to one another. FIG. 2C shows features 205 defined in the linear design style, wherein each feature 205 extends diagonally according to a positive slope relative to the x and y directions, and each feature 205 is parallel to one another. FIG. 2D shows features 207 defined in the linear design style, wherein each feature 207 extends diagonally according to a negative slope relative to the x and y directions, and each feature 207 is parallel to one another.

With reference to FIGS. 2A-2D, it should be appreciated that a given layer of the die can include any number of features defined in the linear design style. Each linear feature can be defined to have any line segment length that is necessary for its intended function. In general, each linear feature is defined to have a number of contact locations to enable layer-to-layer registration in the chip. It should be appreciated that some designs may not require linear features to be defined across the entire layer or layer sub-region. However, in one embodiment, the photolithography process may be simplified or optimized by having linear features defined to extend across the entire layer or layer sub-region. In this embodiment, a given line traversing the entire layer or layer sub-region can be defined by multiple linear feature segments or a single linear feature segment. In this embodiment, portions of the layer that do not require linear feature segments can be defined to have dummy linear feature segments. The dummy feature segments will not have contact locations for layer-to-layer registration. However, the dummy feature segments will allow the regularity of the linear design style to be preserved across the layer or layer sub-region.

Figure 2E:
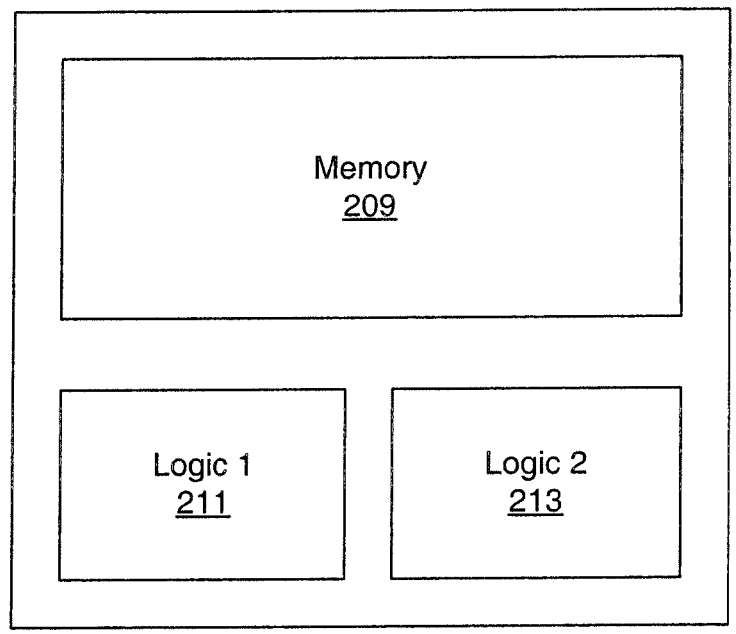
FIG. 2E is an illustration showing an exemplary chip layer including multiple layer sub-regions, in accordance with one embodiment of the present invention.

As mentioned above, the linear design style can be applied to an entire layer of the chip or to sub-regions within a layer of the chip. FIG. 2E is an illustration showing an exemplary chip layer including multiple layer sub-regions, in accordance with one embodiment of the present invention. The exemplary chip includes a memory layer sub-region 209, a first logic layer sub-region 211, and a second logic layer sub-region 213. When designing the chip in the linear design style, each layer sub-region is defined in the linear design style. However, each layer sub-region in a given layer of the chip may be defined using a different variation of the linear design style. A single orientation is preferred, for optimal photolithography conditions, but is not required.

Figure 2F:
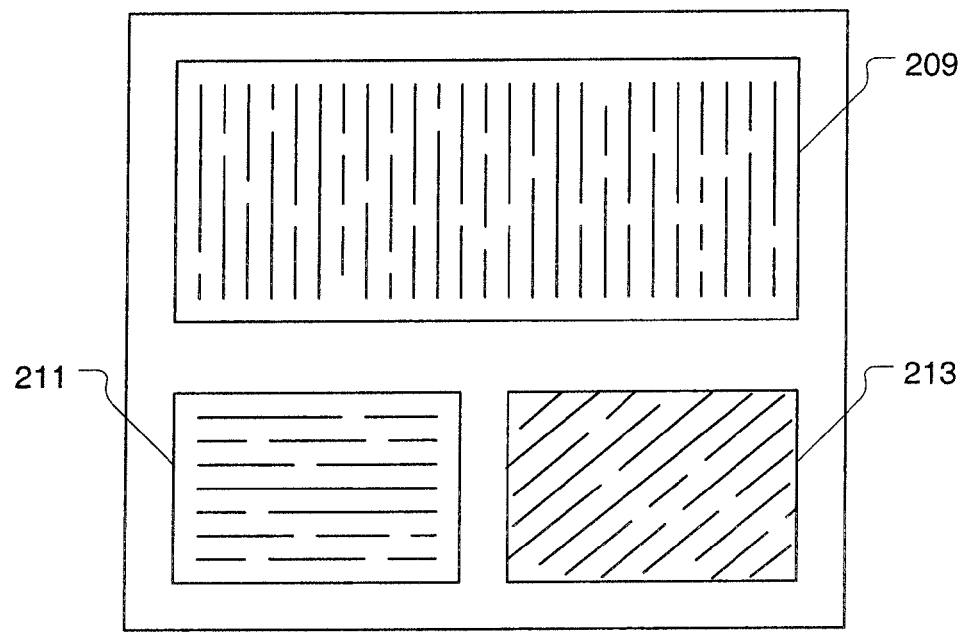
FIG. 2F is an illustration showing an exemplary layout in the linear design style for a particular layer within the exemplary chip of FIG. 2E, in accordance with one embodiment of the present invention.

FIG. 2F is an illustration showing an exemplary layout in the linear design style for a particular layer within the exemplary chip of FIG. 2E, in accordance with one embodiment of the present invention. Each of the memory sub-region 209, the first logic sub-region 211, and the second logic sub-region 213 are defined in the linear style, but in a different variation of the linear design style within the particular layer of the chip. As illustrated by the example of FIG. 2F, the chip may include an array of layer sub-regions, wherein each layer sub-region is designed independently according to the linear design style. Thus, the layout of each layer sub-region enables use of simplified, i.e., one-dimensional, lithographic gap compensation techniques. In one embodiment, lithographic gap compensation techniques can be further simplified by using the linear design style in combination with a fixed set of feature pitches, wherein the feature pitch is defined as the width of the linear feature plus the separation distance between an adjacent feature.

Due to the predictability of optical interactions in the linear design style when patterning photoresist in the photolithography process, a fabrication process window associated with the linear design style can be readily optimized. For example, use of regular/repeating linear features limits the number of optical interactions, such that forbidden feature pitches and other optical effects can be accurately and reliably calculated/predicted. Then, based on the reliably calculated/predicted optical effects, a set of design rules can be developed for use in conjunction with the linear design style. It should be appreciated that due to the limited variability in the linear design style, the corresponding design rules can be limited in number and complexity as compared to the design rules associated with the general design style. The design rules for the linear design style govern the layout of the linear features in each layer or layer sub-region within the chip.

As discussed above, the design rules for the linear design style are based in-part on the nature of the linear design style, such as how optical interactions will occur when patterning the linear features. However, as discussed below, the design rules for the linear design style are also based on fabrication process capabilities and the extent to which a designer wishes to "push" the fabrication process capabilities. The extent to which a designer wishes to push the fabrication process capabilities represents the risk that the designer is willing to take with respect to successfully fabricating the chip. For example, if the designer is more risk averse, i.e., yield loss averse, the designer may define a narrower (tighter) set of design rules that essentially ensures successful fabrication based on the known fabrication process capabilities. Alternatively, if the designer is more accepting of risk, i.e., willing to tolerate an amount of yield loss, the designer may define a broader (looser) set of design rules corresponding to a given probability of successful fabrication based on the known fabrication process capabilities. In determining the risk level to be applied, the designer will consider how the set of design rules associated with the various risk levels relates to parameters such as chip area (number of chips per wafer), yield loss (number of defective chips per wafer on average), chip performance (speed, power consumption, etc.), and fabrication costs, among others.

To better describe risk as it relates to the present invention, it is beneficial to first discuss how fabrication process capability can be quantified. It should be appreciated that the capability of each fabrication process, e.g., photolithography, etching, diffusion, implantation, deposition, etc., can be measured by the on-chip result of performing the fabrication process. Also, it should be appreciated that the on-chip result of any given fabrication process is subject to variability, such that the on-chip result can be characterized by a statistical distribution having a mean and a standard deviation. Additionally, it should be understood that fabrication process capabilities correspond to the design style being implemented. Therefore, when implementing the linear design style, the fabrication process capabilities are measured relative to fabrication of chip features having been laid out in the linear design style.

Figure 3A:
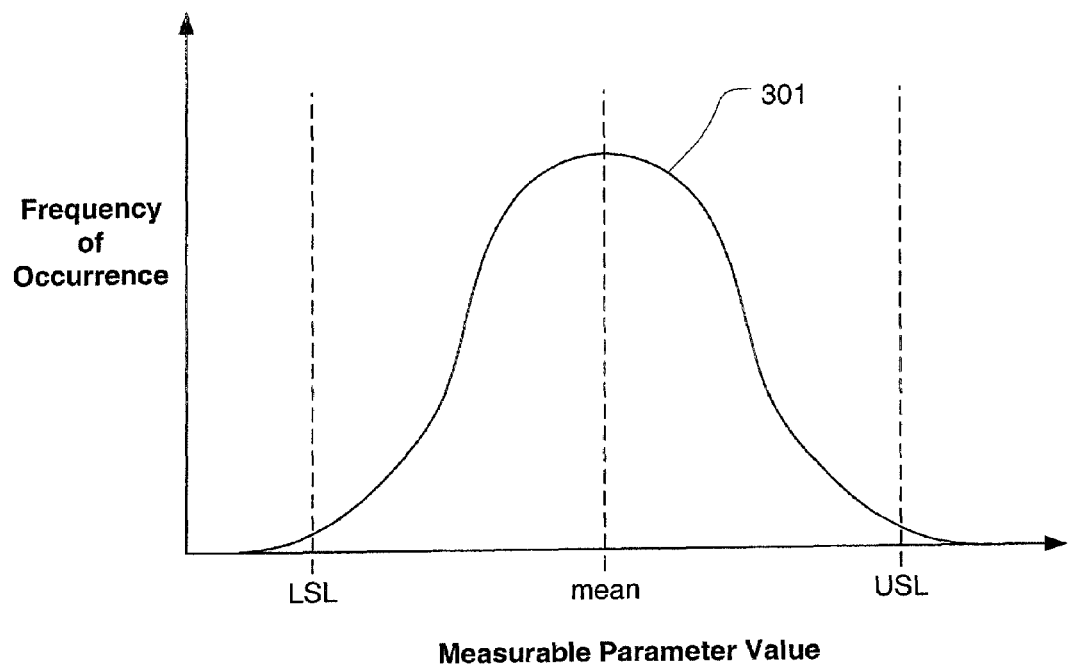
FIG. 3A is an illustration showing an exemplary distribution for a measurable parameter associated with a fabrication process, in accordance with one embodiment of the present invention.

Each fabrication process has a number of associated measurable parameters that can influence the as-fabricated product. Associated with each of these measurable parameters is an upper specification limit (USL), a lower specification limit (LSL), and a nominal expectation (target). FIG. 3A is an illustration showing an exemplary distribution 301 for a measurable parameter associated with a fabrication process, in accordance with one embodiment of the present invention. For example, the distribution 301 of FIG. 3A may represent a doping density that is achieved in an ion implantation fabrication process. However, it should be understood that essentially any measurable characteristic of the as-fabricated chip that can be correlated to a fabrication process can be represented by a distribution similar to what is depicted in FIG. 3A. Generally speaking, the LSL and USL values for a particular parameter are established based on design requirements and the process capability with respect to the particular parameter, i.e., the characteristics of the distribution for the particular parameter. Therefore, once established, the LSL and USL values for a particular parameter are not usually subject to change during a chip fabrication run.

The capability of a particular fabrication process is generally defined by the corresponding fabrication equipment. Although the fabrication equipment is generally not subject to change during the chip fabrication run, the associated distribution representing the capability of the fabrication process with respect to a given parameter may change during the chip fabrication run. For example, over a number of fabrication cycles, a given fabrication process may drift such that the distribution of the measurable parameter associated with the given fabrication process also drifts.

Figure 3B:
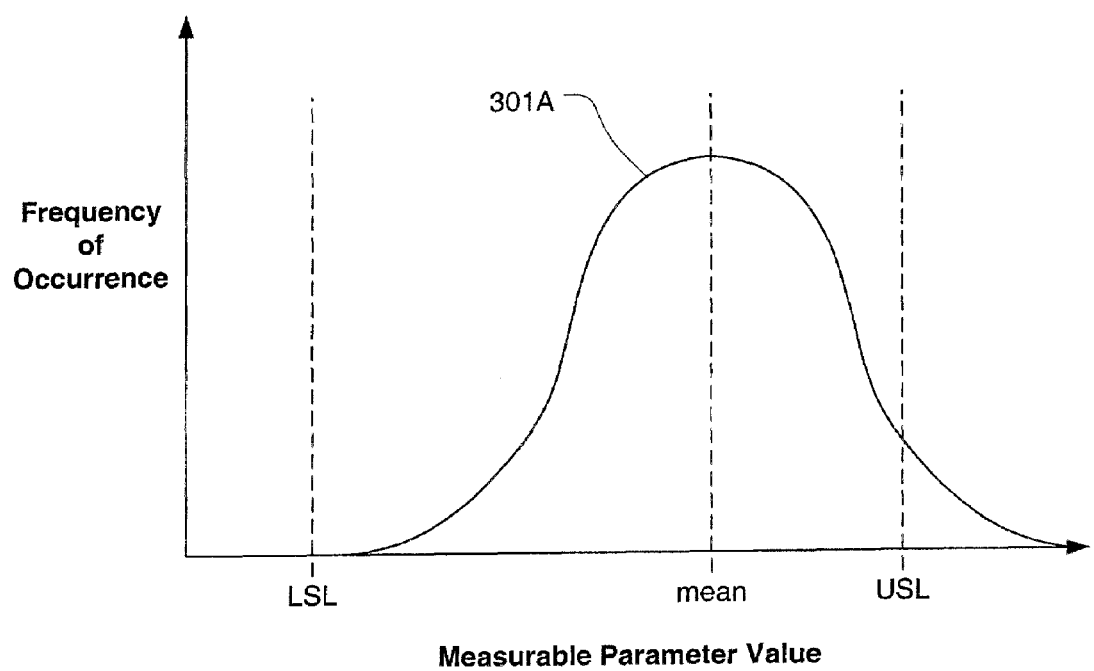
FIG. 3B is an illustration showing the parameter distribution of FIG. 3A following an exemplary process drift.

FIG. 3B is an illustration showing a distribution 301A representing the parameter distribution 301 of FIG. 3A following an exemplary process drift. When the distribution of the parameter drifts, the mean value of the parameter drifts. However, because the LSL and USL generally do not change with the number of fabrication cycles, drift in the mean of the parameter can cause a change in the number of instances where the parameter falls outside either the LSL or the USL. Consequently, if the process is drifting and the LSL and USL values are fixed, the expectations for satisfying the LSL and USL values based on the pre-drift process will be invalid. Once the expectations for meeting design specification limits (LSL/USL) are no longer valid, control of the design is lost and any of a large number of problems are likely to occur, perhaps most notably unexpected yield loss.

Figure 3C:
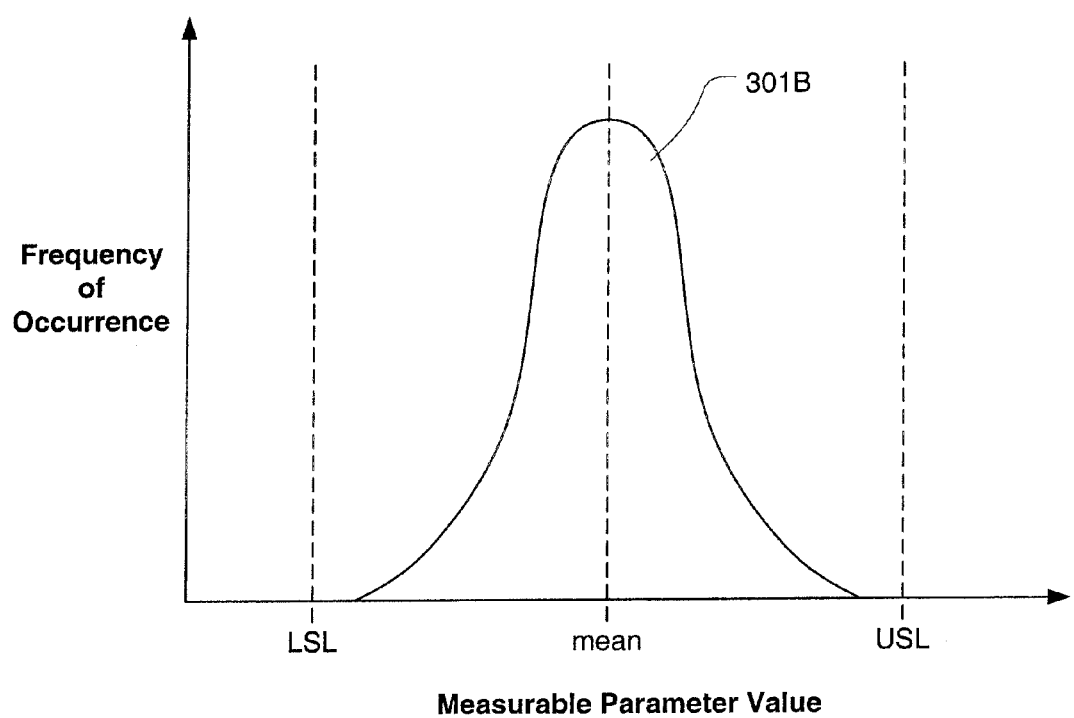
FIG. 3C is an illustration showing the parameter distribution of FIG. 3A following an exemplary process maturation.

In addition to process drift, process maturation also occurs with an increasing number of fabrication cycles. As a fabrication process matures, the parameter distributions associated with the process can become narrower and/or more centered about the target. FIG. 3C is an illustration showing a distribution 301B representing the parameter distribution 301 of FIG. 3A following an exemplary process maturation. Also, as a fabrication process matures, the mean of the parameter distributions may become better centered with respect to the target, thus reducing the likelihood and impact of further process drift. Therefore, fabrication processes may improve with an increasing number of fabrication cycles.

The expected improvement in parameter distributions resulting from fabrication process maturation can be considered in establishing the LSL and USL values. For example, at the beginning of a product run, the parameter distribution for a given fabrication process may be wider than the LSL and USL, and the parameter mean may be unstable. Thus, at the beginning of the product run, device yield loss may be higher than what is ultimately desired. However, if the product run is to be performed over a large number of fabrication cycles, maturation of the fabrication process may cause the parameter distribution to narrow and stabilize. When the parameter distribution narrows and stabilizes, the number of parameter instances, i.e., chip instances, outside the LSL and USL will decrease, preferably to a point of acceptable yield loss.

An optimal parameter distribution is one that lies within the LSL and USL values such that a yield loss target is satisfied. It should be appreciated that satisfying a yield loss target may not mean having zero yield loss. For example, zero yield loss for a design may mean that there is too much margin in the design, i.e., the product is over-designed. It should be appreciated that the additional expense and complexity of over-designing a product may exceed the expense of some amount of yield loss. In another example, fabrication of a small number of units of a product may be required, wherein each unit has a high value. In this example, the maturation of the fabrication process may not be substantial over the duration of the product run. Thus, in this example, the LSL and USL values may be conservatively specified to substantially bound the expected initial parameter distribution with minimal yield loss.

In establishing design rules for a given design style, it is important to understand how fabrication process parameter distributions within the given design style relate to LSL and USL values. The present invention provides a method for determining the process capability using the parameter Cpk to quantify the relationship between a particular fabrication process parameter distribution and its associated target, LSL, and USL values.

To facilitate description of Cpk, consider the parameter distribution of FIG. 3A having a mean (xbar), a standard deviation (sigma), a lower specification limit (LSL), and an upper specification limit (USL). To determine Cpk, it is necessary to determine the capability of the fabrication process relative to the LSL, i.e., Cpl, wherein Cpl=[(xbar−LSL)/(3*sigma)]. Thus, Cpl represents the fraction of three standard deviations that is between the mean and the LSL. It is also necessary to determine the capability of the fabrication process relative to the USL, i.e., Cpu, wherein Cpu=[(USL−xbar)/(3*sigma)]. Thus, Cpu represents the fraction of three standard deviations that is between the mean and the USL. Cpk is determined as the minimum of Cpl and Cpu, i.e., Cpk=min{Cpl,Cpu}. Thus, Cpk represents the minimum fraction of three standard deviations that is between the mean and either the LSL or USL.

Cpk represents the minimum capability of a fabrication process relative to either the LSL or the USL for a given measurable parameter. The Cpk parameter provides a combined measure of the parameter distribution width and how well centered the parameter distribution mean is between the LSL and USL. Because the LSL and USL represent the requirements of the process, and the standard deviation (sigma) represents the capabilities of the process, the Cpk parameter quantifies the relationship between the requirements of the process and the capabilities of the process. The Cpk parameter provides an indication as to whether the parameter distribution mean has shifted in either direction, such that the fabrication process has drifted out of bounds as defined by the LSL and USL. It should be understood that a larger Cpk value indicates that the corresponding fabrication process is more tolerant to variations in the mean, i.e., fabrication process drift.

The Cpk value can be modified by changing the corresponding fabrication process capability, i.e., the standard deviation of the fabrication process parameter distribution. The fabrication process capability can be improved by improving the fabrication equipment or by restricting the design style such that fabrication processes can be better optimized. The present invention provides for improving fabrication process capability by implementing the linear design style. As previously discussed, use of the linear design style enables the fabrication processes and associated lithographic gap compensation techniques to be optimized for fabrication of linear features having one-dimensional variability. The improved process capability serves to increase Cpk by reducing the standard deviation of the fabrication process parameter distribution. Therefore, if a larger minimum Cpk value is required, reduction in the standard deviation of the fabrication process parameter distribution through use of the linear design style enables the larger minimum Cpk value requirement to be more easily satisfied.

The Cpk value can also be modified by changing the specification limits, i.e., LSL and/or USL. The present invention enables the specification limits to be changed by restricting the design environment through design rules that are defined based on a selected minimum Cpk value. For example, if a particular minimum Cpk value is selected for a particular fabrication process to be performed on a particular layer of the chip, design rules for the layout of the particular layer of the chip will be defined to ensure that the selected minimum Cpk value is satisfied given the linear design style being used.

The defined design rules will in turn determine what the acceptable LSL and USL values are for the particular fabrication process to be performed on the particular layer of the chip, such that the selected minimum Cpk value is maintained or exceeded.

In one embodiment of the present invention, the selected minimum Cpk value is used to determine which design rules are applied in generating a base array. The system designer selects a minimum Cpk value to be used in defining the base array. The minimum Cpk value is selected based on Cpk-dependent factors such as expected yield loss and chip size. For example, a lower minimum Cpk value selection corresponds lower minimum required separation between the fabrication parameter distribution mean and either the LSL or USL. Thus, with a lower minimum Cpk value selection, the mean of the fabrication parameter distribution is allowed to move, i.e., drift, more between the LSL and USL. Therefore, with an associated increased tolerance for drift in the mean of the fabrication process parameter distribution, the lower minimum Cpk value selection can translate into less restrictive design rules. The less restrictive design rules may provide a designer with more design options. Also, the less restrictive design rules may enable a reduction in feature sizes or a reduction in required spacing between features, which could result in a reduced chip size. It should be appreciated that a reduced chip size may allow for more chips to be defined on a single wafer, thus increasing the potential chip yield per wafer.

Although selection of a lower minimum Cpk value has potential benefits with respect to less restrictive design rules and/or reduced chip size, selection of a lower minimum Cpk value can also have some adverse effects. For example, selection of a lower minimum Cpk value may result in an increase in yield loss. More specifically, if the fabrication process parameter distribution has a sufficiently large standard deviation, the increased tolerance for drift in the mean of the fabrication process parameter distribution, as enabled by selection of the lower minimum Cpk value, will potentially increase the number of product instances that fail to satisfy the LSL or USL requirements. Thus, selection of a lower minimum Cpk value can potentially lead to increased yield loss. The yield loss due to Cpk value selection can be described as Cpk-dependent risk. Risk is defined as probability multiplied by consequence. The probability influencing the Cpk-dependent risk corresponds to the probability of yield loss due to Cpk value selection. The consequence influencing the Cpk-dependent risk corresponds to the impact of sustaining yield loss due to Cpk value selection. In accordance with the foregoing, it should be understood that selection of a lower minimum Cpk value corresponds to allowance of broader design rules and acceptance of a higher risk at potentially decreased expense.

Selection of a higher minimum Cpk value corresponds to an increase in the minimum required separation between the fabrication parameter distribution mean and either the LSL or USL. Thus, with a higher minimum Cpk value selection, the mean of the fabrication parameter distribution is allowed to move, i.e., drift, less between the LSL and USL. Therefore, with an associated decreased tolerance for drift in the mean of the fabrication process parameter distribution, the higher minimum Cpk value selection can translate into more restrictive design rules. The more restrictive design rules may require an increase in feature size or an increase in required spacing between features, which could result in a larger chip size. It should be appreciated that a larger chip size may result in a decreased chip yield per wafer.

The decreased tolerance for drift in the mean of the fabrication process parameter distribution, as enabled by selection of the higher minimum Cpk value, is likely to decrease the number of product instances that fail to satisfy the LSL or USL requirements. Thus, selection of a higher minimum Cpk value can decrease yield loss and reduce Cpk-dependent risk. In accordance with the foregoing, it should be understood that selection of a higher minimum Cpk value corresponds to acceptance of narrower design rules and lower risk at potentially increased expense.

The Cpk value selection represents a means by which a designer can apply a risk profile to a product, e.g., chip or portion thereof, wherein the risk is measured with respect to yield loss and can be projected over the duration of the product run. If the consequence of product yield loss is significant, a higher minimum Cpk value may be selected. For example, if a design has a short product life and needs to be fabricated and function correctly on the first fabrication pass, the minimum Cpk value requirement may be dialed to a higher value to address the significant consequence associated with the design failing. In contrast, if the consequence of product yield loss is not significant, a lower minimum Cpk value may be selected. For example, if a design has a high volume that can afford multiple passes to perfect, the minimum Cpk value requirement may be dialed to a lower value to reflect the less significant consequence associated with the design failing.

Figure 4:
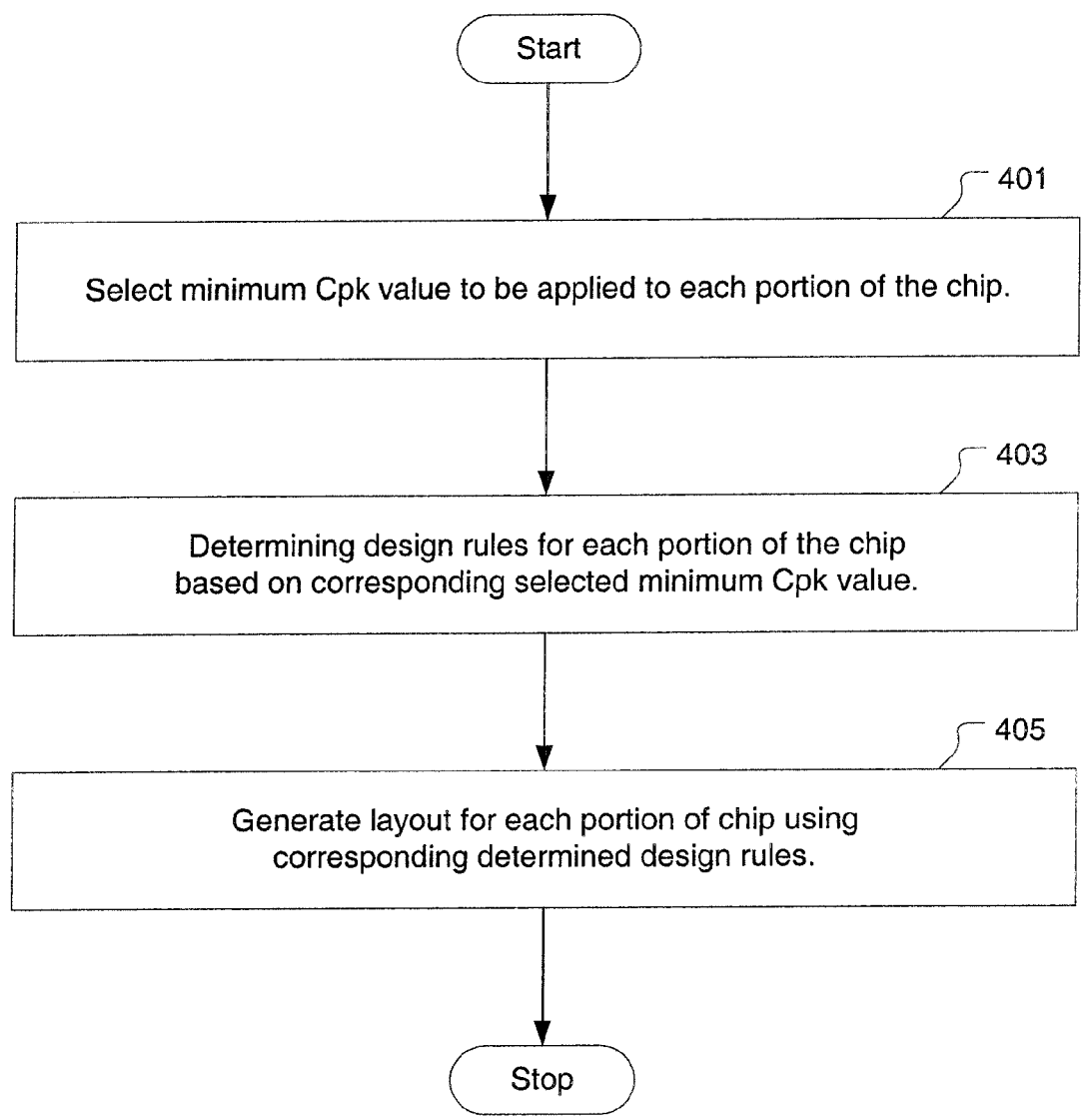
FIG. 4 is an illustration showing a flowchart of a method for developing a Cpk-driven chip layout, in accordance with one embodiment of the present invention.

FIG. 4 is an illustration showing a flowchart of a method for developing a Cpk-driven chip layout, in accordance with one embodiment of the present invention. As previously discussed, the minimum Cpk value for a layer within a chip represents a balance between the frequency at which defects occur within the layer, i.e., yield loss, and the areal size of the layer, i.e., size of chip. Therefore, when selecting the minimum Cpk value for a layer within the chip, the designer is essentially balancing yield loss with chip size. The method of FIG. 4 for developing the Cpk-driven chip layout enables a designer to control the balance between yield loss and chip size.

The method includes an operation 401 for selecting a minimum Cpk value to be applied to each portion of the chip, wherein each portion of the chip corresponds to either a layer or layer sub-region within the chip. As previously discussed, the minimum Cpk value directly influences yield loss and, therefore, is a control parameter of risk in terms of yield loss. Operation 401 enables the designer to establish a risk profile for the chip on a layer and/or layer sub-region basis.

In one embodiment, the minimum Cpk value to be applied to each portion of the chip is selected directly by the designer. In another embodiment, the designer may select the minimum Cpk value for a particular portion of the chip in terms of risk to be applied to the particular portion of the chip. Essentially any number of risk options can be provided to the designer. For example, the risk options may be low, medium, high. Each risk option can correspond to a pre-determined target minimum Cpk value. Alternatively, based on the risk profile for the chip, appropriate minimum Cpk values can be synthesized for each portion of the chip, such that the established risk profile for the chip is implemented.

It should be appreciated that a different minimum Cpk value can be selected/synthesized for each layer or layer sub-region within the chip. For example, a different minimum Cpk value can be used for an interconnect layer as compared to an underlying base array layer. The ability to establish different minimum Cpk values for different portions of the chip enables a designer to establish a risk profile for the chip that considers the various fabrication process capabilities. For example, because front end processes (defining polysilicon layers, diffusion regions, etc.) used to manufacture transistors are well-developed, the designer may be willing to take a greater risk with the front end processes than with less developed processes. Also, the designer may wish to push the design a bit more in parts of the chip that will be fabricated using newer equipment that is known to be well-operated. The designer may wish to be more conservative with the design in parts of the chip that will be fabricated using older equipment or processes that have not received as much improvement. Additionally, as the wafer is manufactured and more layers are fabricated, the designer may increase the minimum Cpk value to reflect the more significant consequence of having to throw away a mostly completed wafer. For example, the minimum Cpk value for a first metal layer may be less than minimum Cpk value for a sixth metal layer.

The method continues with an operation 403 for determining design rules for each portion of the chip based on the corresponding minimum Cpk value selected in operation 401. Application of a given set of design rules serves to constrain a particular fabrication process such that a corresponding process parameter distribution results. Using a particular Cpk value calculation option, a Cpk value is calculated for the process parameter distribution associated with the given set of design rules. If the calculated Cpk value for the process parameter distribution associated with the given set of design rules satisfies the selected minimum Cpk value, the given set of design rules is acceptable.

In one embodiment, the designer is allowed to select the particular Cpk value calculation option to be applied in determining whether the selected minimum Cpk value is satisfied. For example, in determining design rules for a given portion of the chip, the designer may be provided with Cpk value calculation options including 3-sigma, 4-sigma, 5-sigma, and 6-sigma. The 3-sigma through 6-sigma options correspond to variations in how the denominator portion of the Cpu and Cpl values are calculated. More specifically, selection of either the 3 sigma, 4 sigma, 5 sigma, or 6 sigma values will cause the denominator in each of Cpu and Cpl to be set to (1.5*sigma), (2*sigma), (2.5*sigma), and (3*sigma), respectively. Selecting a lower sigma value causes each of Cpu and Cpl to be larger, thus causing a larger Cpk value to be calculated for comparison with the minimum Cpk value. Conversely, selecting a higher sigma value causes each of Cpu and Cpl to be smaller, thus causing a smaller Cpk to be calculated for comparison with the minimum Cpk value. Thus, using a higher sigma value makes it more difficult to satisfy the minimum Cpk value requirement, thus causing the design rules to be tighter.

When the method is used in combination with the linear design style, the design rules are determined based on the various fabrication and lithography capabilities associated with the linear design style. Given the linear design style, the design rules for a particular portion of the chip are defined such that the selected minimum Cpk value for the particular portion of the chip can be satisfied. It should be appreciated that design rules for the particular portion of the chip can be determined based on both the selected minimum Cpk value and the function of the particular portion of the chip. For example, a memory portion of the chip and a random logic portion of the chip may have the same minimum Cpk value selection, but the design rules for the memory portion of the chip may differ from those of the random logic portion. In this example, redundancy in the memory portion of the chip may allow for more flexibility in the design rules, whereas the critical nature of the random logic necessitates a tighter set of design rules. It should be understood, however, that the design rules determined for the memory and random logic portions of the chip will enable their minimum Cpk value to be satisfied.

The method continues with an operation 405 for generating a layout for each portion of the chip using the corresponding design rules determined in operation 403. When using the linear design style, the layout for a given portion of the chip is defined in the linear design style based on the design rules determined for the given portion of the chip, such that the corresponding selected minimum Cpk value is satisfied. The chip is then fabricated using the generated layouts with the expectation that the established risk profile for the chip will be reflected in chip yield. The method of FIG. 4 enables a designer to balance chip yield with chip size by establishing a desired risk profile for the chip in terms of minimum Cpk values, and by implementing the desired risk profile through appropriate design rules that are defined to achieve the minimum Cpk values.

Figure 5:
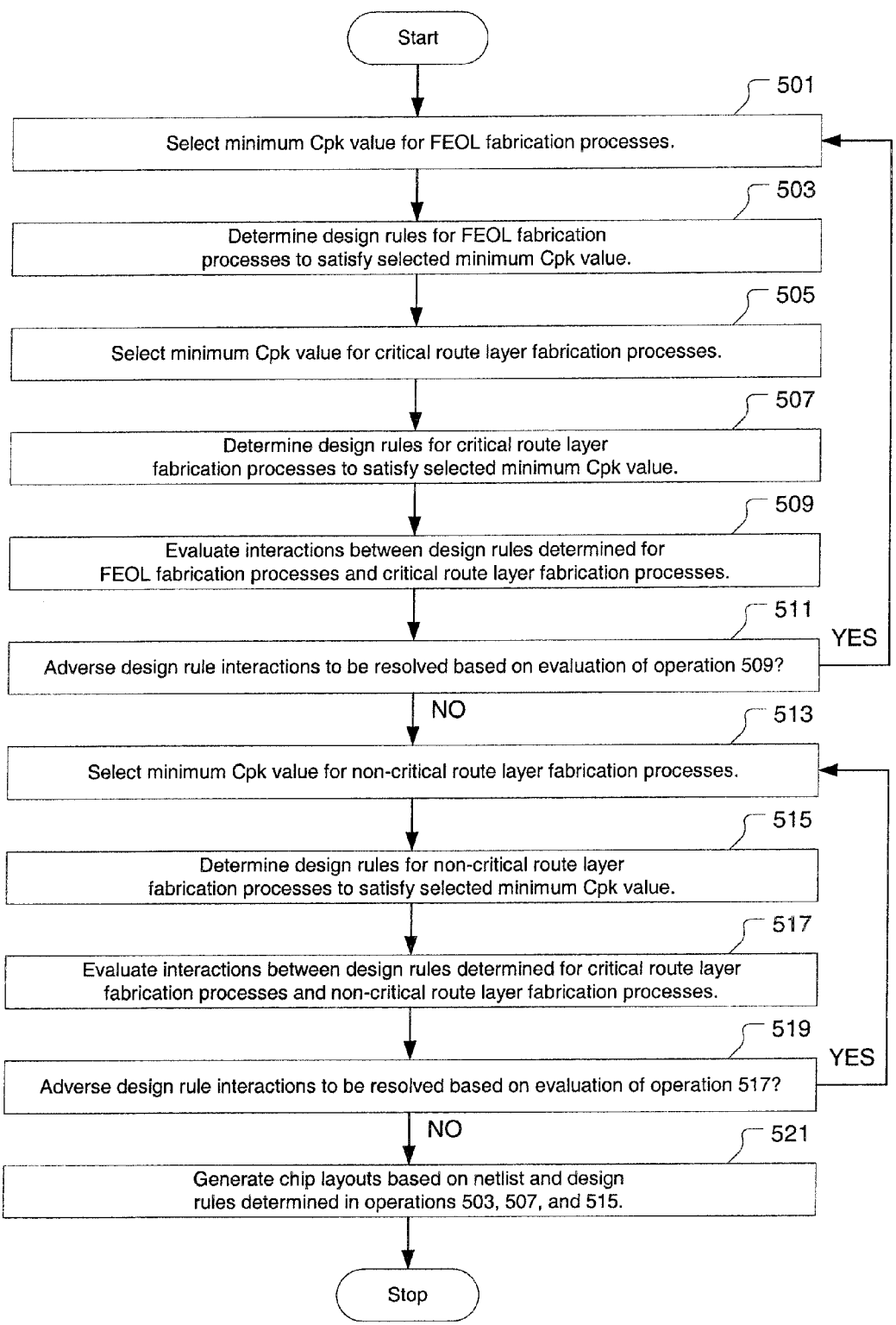
FIG. 5 is an illustration showing a flowchart of a method for generating a chip layout based on Cpk selection, in accordance with one embodiment of the present invention.

FIG. 5 is an illustration showing a flowchart of a method for generating a chip layout based on Cpk selection, in accordance with one embodiment of the present invention. An operation 501 is provided for selecting a minimum Cpk value for the front end of line (FEOL) fabrication processes in which transistor devices are formed. The minimum Cpk value selected for the FEOL fabrication processes will set the chip area. Therefore, in selecting the minimum Cpk value for the FEOL fabrication processes, a designer should consider the balance between chip area and risk in terms of yield loss. The method continues with an operation 503 for determining design rules for the FEOL fabrication processes that will ensure satisfaction of the minimum Cpk value selected for the transistor devices in operation 501.

The method continues with an operation 505 for selecting a minimum Cpk value for the critical route layer fabrication processes. In one embodiment, the critical route layers are defined as the first through fourth metal layers. However, it should be appreciated that the critical route layers can include any number of metallization layers that are defined to interface directly with transistor devices formed in the FEOL fabrication processes. The method continues with an operation 507 for determining design rules for the critical route layer fabrication processes that will ensure satisfaction of the minimum Cpk value selected for the critical route layers in operation 505.

The method continues with an operation 509 for evaluating design rule interactions between the design rules determined for the FEOL fabrication processes in operation 503 and the design rules determined for the critical route layers in operation 507. Evaluation of design rule interactions in operation 509 considers a number of FEOL-to-critical route layer interfaces that can be affected by use of particular FEOL design rules and/or critical route layer design rules. For example, both the FEOL design rules and the critical route layer design rules can affect the transistor-to-routing layer registration. The method includes a decision operation 511, for determining whether adverse design rule interactions are to be resolved based on the evaluation of operation 509. If adverse design rule interactions are to be resolved, the method reverts back to operation 501 to enable the designer to may adjustments in the FEOL and critical route layer minimum Cpk value selections, as appropriate. If the evaluation of operation 509 indicates acceptable design rule interaction, the method proceeds from operation 511 to operation 513.

In operation 513, a minimum Cpk value is selected for the non-critical route layer fabrication processes. It should be appreciated that the non-critical route layers can include any number of metallization layers that are defined to interface with the critical route layers. The method continues with an operation 515 for determining design rules for the non-critical route layer fabrication processes that will ensure satisfaction of the minimum Cpk value selected for the non-critical route layers in operation 513.

The method continues with an operation 517 for evaluating design rule interactions between the design rules determined for the critical route layers in operation 507 and the design rules determined for the non-critical route layers in operation 515. The method includes a decision operation 519, for determining whether adverse design rule interactions are to be resolved based on the evaluation of operation 517. If adverse design rule interactions are to be resolved, the method reverts back to operation 513 to enable the designer to make adjustments in the non-critical route layer minimum Cpk value selection. If the evaluation of operation 517 indicates acceptable design rule interaction, the method proceeds with operation 521 in which chip layouts are generated based on a netlist and the design rules determined in operations 503, 507, and 515.

As discussed above, the present invention provides a method for aligning the design environment with the fabrication process environment. By selecting appropriate Cpk values, a designer can generate a statistical based chip design that balances yield, chip size, and design aggressiveness. Additionally, based on expected chip yield statistics associated with a particular risk profile, as established through minimum Cpk value selection, the designer can project costs reliably over the duration of a chip fabrication run or product lifetime. It should be appreciated that the Cpk-based layout design methods of the present invention can be used to design any type of chip including, but not limited to, base arrays and FPGAs. Also, when designing programmable logic devices, establishment of a risk profile for the device, i.e., selection of minimum Cpk values for various layers or layer sub-regions, can include consideration of an ability to map around defects. For example, if a potential defect can be mapped around when programming the logic device, a lower risk and lower minimum Cpk value may be applied to the region of the device that includes the potential defect.

It should also be appreciated that any of the methods or portions thereof as described herein can be embodied as computer readable code on a computer readable medium. The computer readable medium is any data storage device that can store data which can be thereafter be read by a computer system. Examples of the computer readable medium include hard drives, network attached storage (NAS), read-only memory, random-access memory, CD-ROMs, CD-Rs, CD-RWs, magnetic tapes, and other optical and non-optical data storage devices. The computer readable medium can also be distributed over a network coupled computer systems so that the computer readable code is stored and executed in a distributed fashion. Additionally, a graphical user interface (GUI) implemented as computer readable code on a computer readable medium can be developed to provide a user interface for performing any embodiment of the present invention.

While this invention has been described in terms of several embodiments, it will be appreciated that those skilled in the art upon reading the preceding specifications and studying the drawings will realize various alterations, additions, permutations and equivalents thereof. Therefore, it is intended that the present invention includes all such alterations, additions, permutations, and equivalents as fall within the true spirit and scope of the invention.

What is claimed is:

1. A method for generating a chip layout based on fabrication process capability, comprising:

selecting a minimum required value for a fabrication process capability factor associated with a fabrication process to be performed on a layer sub-region within a chip based on a balance between yield loss of the chip and size of the chip, wherein the fabrication process is characterized by a measurable parameter, the measurable parameter having an associated distribution representing a frequency of occurrence of values of the parameter, the distribution being defined by a mean and a standard deviation, and wherein the fabrication process capability factor represents a minimum fraction of a number of standard deviations that is between the mean of the parameter distribution and either a lower specification limit or an upper specification limit for the fabrication process;

determining design rules for the layer sub-region within the chip that will enable the selected minimum required value for the fabrication process capability factor associated with the layer sub-region to be satisfied;

generating a layout for the layer sub-region within the chip using the determined design rules associated with the layer sub-region; and recording the generated layout on a computer readable storage medium.

2. A method for generating a chip layout based on fabrication process capability as recited in claim 1, further comprising:

selecting a value for the number of standard deviations; and computing the fabrication process capability factor based on the selected value for the number of standard deviations, wherein a larger selected value for the number of standard deviations causes the determined design rules to be more restrictive.

3. A method for generating a chip layout based on fabrication process capability as recited in claim 1, wherein the design rules for the layer sub-region are determined to constrain the fabrication process such that the parameter distribution corresponding to the constrained fabrication process enables the selected minimum required value for the fabrication process capability factor to be satisfied.

4. A method for generating a chip layout based on fabrication process capability as recited in claim 1, further comprising:

determining a fabrication process capability factor associated with application of the determined design rules to the fabrication process; and verifying that the selected minimum required value for the fabrication process capability factor is less than the determined fabrication process capability factor associated with application of the determined design rules to the fabrication process.

5. A method for generating a chip layout based on fabrication process capability as recited in claim 1, wherein the generated layout for the layer sub-region and the determined design rules associated with the layer sub-region correspond to a linear design style.

6. A method for generating a chip layout based on fabrication process capability as recited in claim 5, wherein the linear design style requires each feature in each layer sub-region within the chip to be linear in shape and positioned in a parallel orientation with respect to adjacent features within the same layer sub-region.

7. A method for generating a chip layout based on fabrication process capability as recited in claim 6, wherein the features that are linear in shape extend in one direction without bending, the one direction being defined within a plane coincident with a layer of the chip.

8. A method for generating a chip layout based on fabrication process capability as recited in claim 6, wherein a fixed separation distance is maintained between adjacent features within a given layer sub-region within the chip.

9. A method for generating a chip layout based on fabrication process capability as recited in claim 8, wherein the fixed separation distance is defined to optimize photolithographic rendering of the features within the given layer sub-region.

* * * * *